United States Patent [19]

Heck

[11] Patent Number: 4,653,117
[45] Date of Patent: Mar. 24, 1987

[54] DUAL CONVERSION FM RECEIVER USING PHASE LOCKED DIRECT CONVERSION IF

[75] Inventor: Joseph P. Heck, Ft. Worth, Tex.

[73] Assignee: Motorola, Inc., Schaumburg, Ill.

[21] Appl. No.: 799,387

[22] Filed: Nov. 18, 1985

[51] Int. Cl.[4] .......................... H04B 1/16; H04B 1/30
[52] U.S. Cl. .................................... 455/209; 455/256;
455/258; 455/259; 455/260; 455/264; 455/316;
455/324
[58] Field of Search ............... 455/139, 207, 208, 209,
455/255, 856, 258, 259, 260, 264, 265, 316, 323,
455/324; 329/150, 151

[56] References Cited

U.S. PATENT DOCUMENTS

| | | | |
|---|---|---|---|
| 3,480,865 | 11/1969 | Sanders | 455/316 |
| 3,614,627 | 10/1971 | Runyan | 455/316 |
| 3,961,262 | 6/1976 | Gassmann . | |
| 4,057,759 | 11/1977 | Genova et al. . | |
| 4,193,035 | 3/1980 | Berger | 455/203 |
| 4,246,653 | 1/1981 | Malm | 375/82 |
| 4,313,211 | 1/1982 | Leland | 455/139 |
| 4,384,357 | 5/1983 | deBuda et al. | 375/81 |
| 4,408,351 | 10/1983 | Maurer et al. | 455/260 |

Primary Examiner—Robert L. Griffin
Assistant Examiner—Elissa Seidenglanz
Attorney, Agent, or Firm—Melvin A. Schechtman; Donald B. Southard

[57] ABSTRACT

A receiver for frequency modulated signals, having down-conversion to a baseband, zero intermediate frequency for selectivity, followed by up-conversion to a non-zero IF for amplification, limiting, and demodulation.

A phase-lock loop locks the frequency of the down-conversion source to the center frequency of the signal coupled to the baseband IF, converting the signal to precisely zero frequency. This avoids the beat note often found in direct conversion systems. The phase-lock loop additionally provides inherent demodulation of the FM signal.

The received FM signal is coupled to the baseband IF through a radio frequency amplifier for improved sensitivity and local oscillator isolation, or through a first IF comprising a mixer, local oscillator, filter, and amplifier.

17 Claims, 4 Drawing Figures

DUAL CONVERSION FM RECEIVER USING PHASE LOCKED DIRECT CONVERSION IF

BACKGROUND OF THE INVENTION

This invention relates generally to radio receivers for frequency modulated (FM) signals and, more particularly, to FM receivers incorporating direct conversion to baseband.

DESCRIPTION OF THE PRIOR ART

Several approaches to FM receiver design are known in the art. The commonly used superheterodyne receiver converts an incoming radio signal to one or more intermediate frequencies at which amplification and frequency selection can more readily be performed than at the frequency of the received signal. Conversion to an intermediate frequency (IF) is accomplished by mixing the received signal with a locally generated oscillator (LO). After filtering and amplification at a first IF, the signal may be immediately demodulated in a detector circuit, which constitutes a "single conversion" receiver. Alternatively, dual and triple conversion designs are known having successive conversion to additional IF's followed by demodulation of the signal.

An undesirable feature of conventional superheterodyne receivers has been the difficulty in applying microelectronic techniques to achieve miniaturization. To fabricate amplifier circuits in monolithic form has long been known, but it has been difficult to integrate the high-Q crystal or ceramic bandpass filters generally used for selectivity at the intermediate frequencies. A solution known in the art is to convert an incoming signal directly to baseband in what is known as a "direct conversion" or "zero-IF" receiver. The local oscillator frequency is made equal to the carrier frequency of the received signal, and the spectrum occupied by the modulation is translated directly to baseband. The necessary sharp selectivity is then achieved through lowpass, rather than bandpass, filtering. Low frequency lowpass filters are readily fabricated in monolithic form, allowing a much greater degree of miniaturization.

Direct conversion receivers for FM signals may include a technique used for single-sideband (SSB) reception known as the "third-" or "Weaver-method," disclosed in Proc. IRE 44 (1956), pages 1703–1705, and the subject of U.S. Pat. No. 2,928,055. As applied to FM detection, the purpose of the technique is to distinguish the modulation information carried by positive and negative frequency excursions about the carrier. When an FM signal is mixed with a down-conversion oscillator to translate it to baseband, equal positive and negative frequency excursions about the carrier result in the same difference frequency, and the polarity of the modulation can no longer be determined without some phase reference. The Weaver method provides two substantially identical paths in which the signal is down-converted to baseband, lowpass filtered to remove the sum products of mixing as well as undesired adjacent channel signals, and up-converted to an output frequency. The down-and up-conversion oscillators for one path are in phase quadrature with their counterparts in the other path. The process of two successive frequency conversions produces phase inversions between the sidebands of the signals in the two paths. When the outputs of the two paths are added, cancellation of the sidebands occurs in such a manner that the modulation polarity of the original input signal is retained, though translated to a new, predetermined output frequency. In effect, the received signal is translated from an incoming frequency to baseband, filtered to remove interfering adjacent channel signals, and retranslated to an output frequency at which conventional FM demodulation can take place. Such a circuit following the Weaver method may be termed a "translating bandpass filter" (TBPF).

Prior art FM receivers following the direct conversion approach suffer from a number of shortcomings. For example, in a direct conversion receiver, the LO frequency equals the received signal carrier frequency, and if no RF preamplifier is used, there is very little reverse isolation to prevent LO energy from reaching the antenna and causing interference with other receivers. Furthermore, noise and DC offsets make it difficult at baseband to achieve the low noise amplification and high gain required for adequate sensitivity.

In a superheterodyne FM receiver, amplitude limiting is generally used to reduce noise and to improve signal capture. However, to maintain fidelity of the modulation in the baseband zero-IF application, both instantaneous amplitude and phase must be preserved. Limiting is not practical. Strong adjacent channel signals that overload the IF can cause distortion if the circuits are not designed for wide dynamic range.

Finally, if there is an offset in frequency between the incoming signal and the down-conversion oscillator in the zero-IF, several undesired results may occur. If the baseband paths are imperfectly matched, the cancellation of mixing products will be incomplete, and a beat-note will occur. The beat-note has a primary component at twice the offset frequency but can have distortion products at other harmonics of the offset frequency. If the beat note is in the audible range, it can interfere with demodulated audio output. Furthermore, the lowpass filter bandwidth necessary to pass an FM modulated signal increases by the amount of the offset, and it becomes difficult to obtain narrow selectivity with other than negligible offsets. It is known in the design of FM receivers for broadcast reception, for example, that a low-level beat-note slightly above the audible band (approx. 20 kHz), caused by a 10 kHz offset, does not interfere with reception. That is because the baseband lowpass filters already have cutoff frequencies on the order of 100 kHz to pass a broadcast FM signal, and they can accommodate a 10 kHz offset without significantly distorting the modulation. However, in other applications, say, for example, the land-mobile service in which channel spacing may be as close as 12.5 kHz, the baseband filtering must be narrower than one-half the spacing, or about 6 kHz, in order to separate the adjacent channel signal from the desired. A frequency offset higher than a few tens of Hertz would require that the baseband filters be widened to accommodate the modulation swing plus offset, and this would degrade selectivity. Frequency offset must therefore be tightly controlled

SUMMARY OF THE INVENTION

It is an object of the present invention to provide a direct conversion FM receiver that nevertheless overcomes the foregoing deficiencies.

It is a more particular object to provide a receiver having direct conversion to baseband to enable the selectivity function to be performed with low frequency lowpass filtering and to thereby facilitate miniaturization through microelectronic techniques.

It is a further object of the invention to provide a zero-IF system with sharp selectivity to be used to receive FM signals transmitted in a narrow channel spacing environment.

It is also an object to avoid the detrimental effects of mismatch in a zero-IF system and to avoid a beat note by providing for precise frequency control of the frequency conversion sources in the IF.

A further object is to include in a direct conversion FM receiver the advantageous placement of the amplification and limiting functions at a non-zero intermediate frequency as in a superheterodyne receiver.

The invention lies in the use of a baseband zero-IF for providing the ultimate selectivity, followed by up-conversion to an intermediate frequency at which amplification and limiting take place. Frequency control by phase lock technique is used to precisely center the zero-IF signal. The phase lock loop also demodulates the received signal.

BRIEF DESCRIPTION OF THE DRAWINGS

The features of the present invention that are believed to be novel are set forth with particularity in the appended claims. The invention itself, however, together with further objects and the advantages thereof, may be best understood by reference to the following description when taken in conjunction with the accompanying drawings, in which:

DETAILED DESCRIPTION OF THE PREFERRED EMBODIMENT

Figure 1:
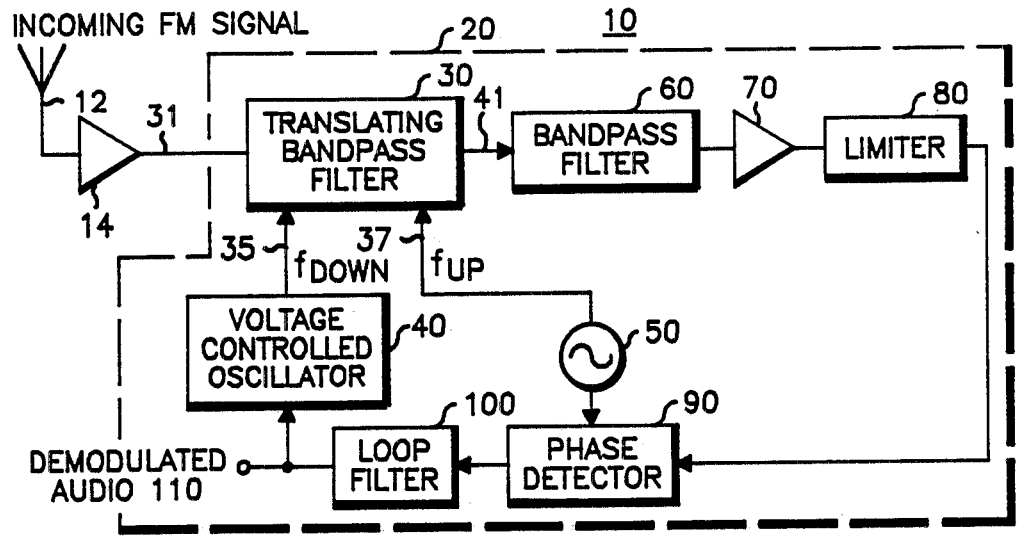
FIG. 1 is a block diagram of an FM receiver which has been constructed in accordance with the present invention.
Figure 2:
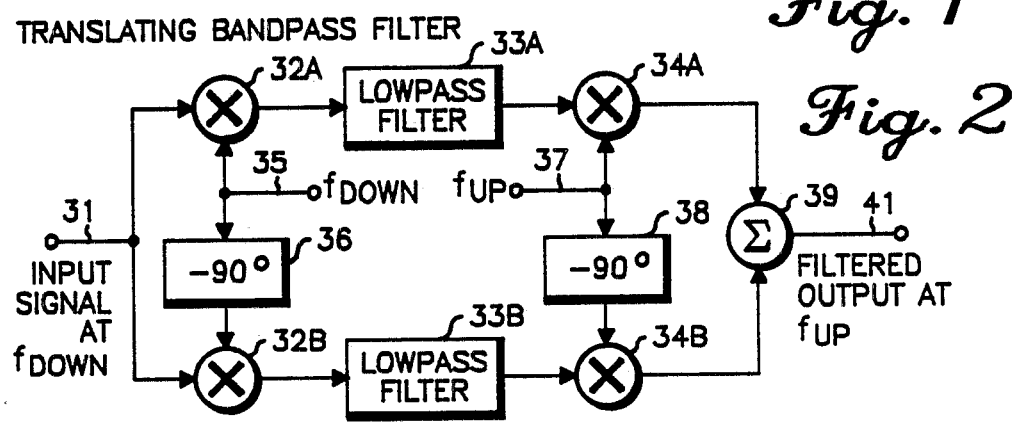
FIG. 2 is a more detailed schematic and block diagram of the translating bandpass filter incorporated in the receiver of FIG. 1.

Referring now to the drawings, an FM receiver 10 is shown in FIG. 1, which receiver has been constructed in accordance with the present invention. An incoming signal 12 is amplified in preamplifier 14, a major function of which is to provide low noise amplification that establishes the sensitivity of the receiver. The preamplifier 14 additionally provides reverse isolation that reduces the escape of radiation from voltage controlled oscillator (VCO) 40. The output of preamplifier 14 feeds a translating bandpass filter 30 (TBPF). Filter 30 may be of a type known in the art for accomplishing direct conversion that is frequently referred to as a "Weaver" circuit. A detailed description of this prior art circuit may be found in Weaver, D. K. Jr. "A Third Method of Generation and Detection of Single-Sideband Signals," Proc. IRE, vol. 44, pp. 1703-1705, December 1956. This circuit translates a signal from a known input frequency to a predetermined output frequency while simultaneously effecting appropriate bandpass filtering. A more detailed description of filter 30 is set forth in FIG. 2 and will be described hereinafter.

The input signal 31 from preamplifier 14 is applied to each of two parallel, substantially identical, paths 32a-33a-34a and 32b-33b-34b. Elements 32a and 32b are like down-conversion mixers that translate the incoming signal to essentially baseband. A down-conversion frequency is supplied at line 35 in quadrature to both mixers 32a and 32b using phase shifter 36 or the equivalent to provide two signals in phase quadrature. The outputs of mixers 32a and 32b are fed to two identical lowpass filters, 33a and 33b, having a cutoff frequency on the order of one-half the bandwidth of the desired passband. The design of these lowpass filters affects the frequency response of the demodulated signal and will be treated below in discussion of the phase lock loop components. The respective outputs of these lowpass filters are coupled to up-conversion mixers 34a and 34b, which are likewise supplied in phase quadrature with frequency $f_{up}$, at 37, through phase-shifter 38 or similar apparatus for providing quadrature signals. The up-converted signals from mixers 34a and 34b are summed in element 39 to provide a bandpass filtered output at a predetermined frequency. The circuit elements of the TBPF require good matching, and it is advantageous to fabricate them in monolithic form.

Referring again to FIG. 1, it may be seen that the incoming signal is translated from frequency $f_{down}$ to frequency $f_{up}$ while being filtered to a desired selection bandwidth. The output 41 of TBPF 30 is then applied in sequence to filter 60, amplifier 70, and then to limiter 80. The purpose of filter 60 is to attenuate harmonics of $f_{up}$ and their sidebands, which may be generated in mixers 34a and 34b in the TBPF. The harmonics must be suppressed so that limiter 80 does not respond to them. It should be noted that filter 60 in fact is unnecessary with certain types of up-conversion mixers. Amplifier 70 and limiter 80 provide the bulk of the receiver gain. Gain in the zero-IF path is intentionally avoided so as to prevent overload, which would result in distortion of the demodulated signal. Limiter 80 functions both to reject amplitude noise variations and to maintain a constant amplitude signal for phase detector 90. This keeps the phase detector gain constant, which is necessary for control of the overall loop gain and closed loop frequency response.

Up-conversion oscillator 50, phase detector 90, loop filter 100, and voltage controlled oscillator (VCO) 40 form a phase lock loop (PLL) that controls the zero-IF down-conversion frequency. The use of a phase lock loop for frequency control and the components constituting the loop are well known in the prior art. For example, see Gardner, F. M., *Phaselock Techniques*, New York: Wiley, 2d ed. 1979, or Blanchard, A., *Phase Locked Loops*, New York: Wiley, 1976.

The output of limiter 80 is applied to phase detector 90, for which it is advantageous to have a wide range phase capability ($\pm 2\pi$ radians). The other input to the phase detector is the in-phase component of $f_{up}$, 37. The phase detector output is applied through loop filter 100 to the control line of oscillator 40, which may be a voltage controlled oscillator (VCO) or voltage controlled crystal oscillator (VCXO). Loop filter 100 is a lowpass filter used to prevent spurious harmonics of the phase detector reference frequency from modulating the controlled oscillator. If a low feedthrough sample-and-hold phase detector is used, filter 100 may be unnecessary. The signal at the oscillator control line, 110, is the demodulated audio of the incoming signal When the loop locks, both inputs to the phase detector are at the same frequency, $f_{up}$. This happens when the frequency of VCO 40 exactly equals the carrier frequency of signal 31 applied to the TBPF 30. Then, the signals in the quadrature baseband paths are precisely centered about zero frequency, and the up-converted output signal 41 equals $f_{up}$. Under these conditions, no beat-note will exist in the baseband paths.

Several design details of the components comprising the translating bandpass filter and the phase lock loop are noteworthy. The phase lock loop not only controls the down-conversion frequency, but it also recovers the modulation of the input signal. The amplitude versus modulation frequency response of the demodulated output is determined by the closed loop response of the oscillator control signal versus deviation frequency. The closed loop frequency response depends on the open loop pole locations and the overall loop gain. To obtain a desired closed loop response, one design technique is to work back to find the appropriate open loop filter response and open loop gain to give the closed loop response.

The dynamic elements of the PLL include lowpass filters 33A and 33B, bandpass filter 60, and loop filter 100. With so many poles of filtering in the loop, it is difficult to maintain stability unless the loop gain falls below unity at a frequency below which 180° of phase shift is reached. It is generally found that the loop gain necessary to satisfy the dual requirements of stability and frequency response is low compared with typical loop gains in phase lock loop demodulators having equivalent bandwidth. This occurs because of the greater number of dynamic filtering elements in the system here. If the phase detector is designed for low spurious output, filtering of its output by loop filter 100 may be avoided, reducing the overall number of poles in the loop and simplifying the design.

Further considerations in the choice of loop components relate to adjacent channel selectivity. Adjacent channel selectivity depends primarily on the open-loop attenuation characteristics of the loop. For best selectivity, the cutoff frequency of the open loop response should be as low as possible. The loop is designed to track the deviation of the input signal up to a predetermined modulation cutoff frequency. For the loop to properly track the input signal, the phase error between the two signal inputs to the phase detector must not exceed the phase difference capability of the detector. The maximum phase error depends on the loop gain, the peak deviation and maximum modulation frequency of the input signal, and the cutoff frequency of the open loop response. Because the loop gain is otherwise made low for stability reasons, and the loop cutoff frequency is low for selectivity reasons, the phase error may be large. It is therefore advantageous to design the phase detector for a wide range phase difference capability.

Because the signals in the translating bandpass filter 30 are centered about zero frequency, DC offsets and carrier feedthrough can affect receiver performance. The chief problem of carrier feedthrough at $f_{up}$ is that it would tend to capture the limiter under weak- or no-signal conditions, causing self-quieting and degrading sensitivity. Feedthrough may be caused by poor carrier suppression in up-conversion mixers 34A and 34B and by DC offsets in the baseband circuits. DC offsets may be minimized by the use of differential circuits in the zero-IF.

Figure 3:
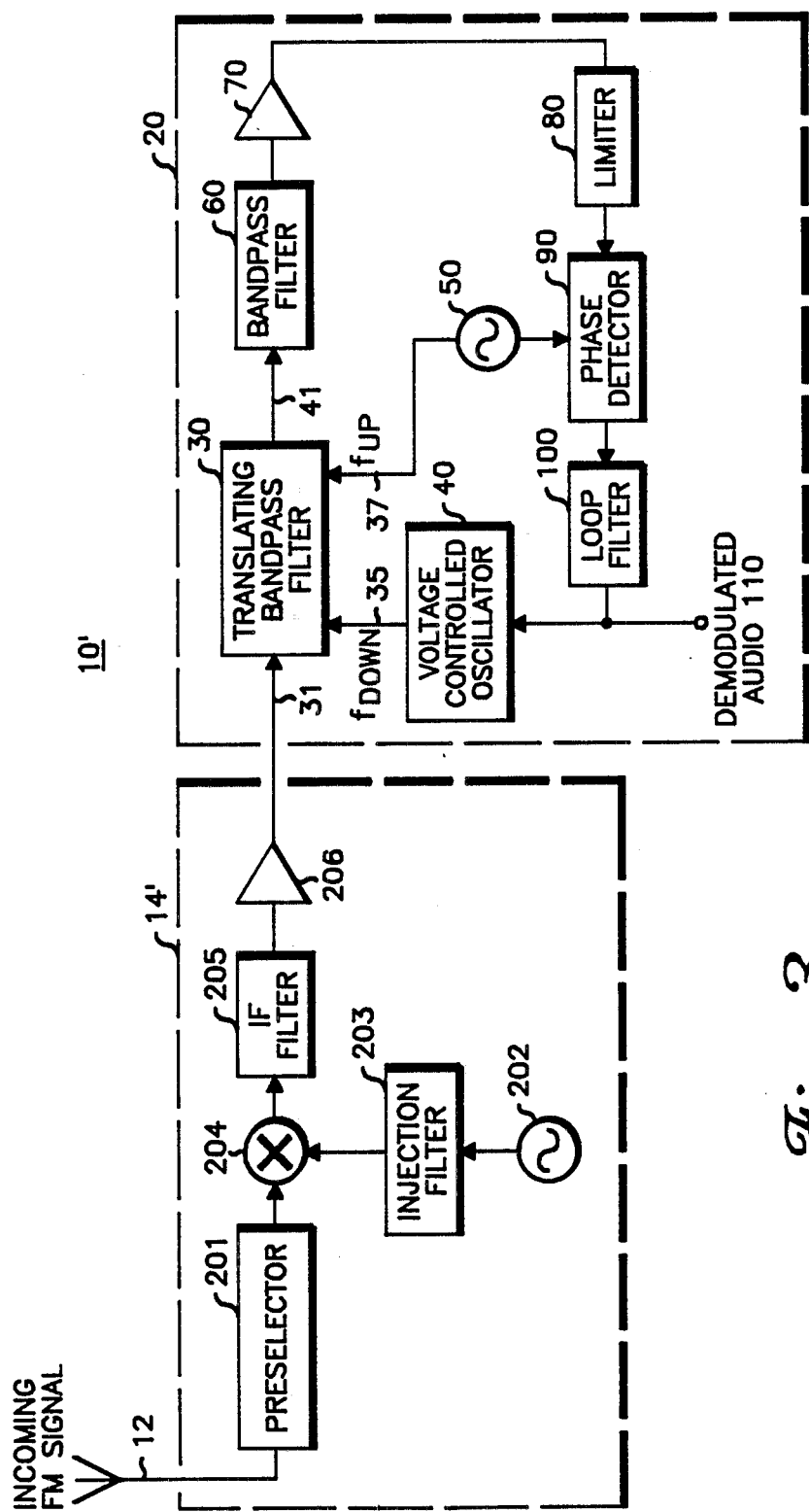
FIG. 3 is an alternate embodiment of the present invention which includes additional front end structure.

The embodiment illustrated in FIG. 1 accomplishes the above mentioned objects of the invention-while providing a particular realization of direct conversion FM receiver. The translating bandpass filter 30 provides a zero-IF system that is adaptable to microelectronic techniques. Through precise frequency control as provided by the phase lock loop, the zero-IF signals are centered at baseband, and no beat note will arise, even with imperfect matching of the quadrature paths. Narrow bandpass filtering is achieved through the use of low frequency lowpass filter elements, which are readily fabricated in monolithic form. Signal amplification is primarily achieved in a non-zero IF, which may be operated in limiting as is known in the FM receiver art to be advantageous for good noise and capture performance. Furthermore, the problem of achieving low noise gain at baseband is avoided through the use of a low noise radio frequency preamplifier that dominates the noise performance of the entire system. It is the cooperation of circuit elements, in particular precise frequency control along with up-conversion to a non-zero IF, that makes possible achieving these objects FIG. 3 shows an embodiment of the invention that illustrates how the teachings of the invention may be used with a first, non-zero IF stage instead of an RF preamplifier. This arrangement can offer improved performance in an environment of strong signals that may cause intermodulation distortion or in which the frequency band of signals to be received is such that low noise amplification is difficult or uneconomical to achieve.

Whereas FIG. 1 illustrates a receiver 10 in which the incoming signal 12 is coupled through preamplifier 14 to the TBPF 30, FIG. 3 depicts receiver 10' used in conjunction with a first IF stage 14' for coupling the incoming signal 12 to the TBPF 30. Stage 14' includes a preselector 201, a first local oscillator 202 and its injection filter 203, mixer 204, first IF filter 205, and IF amplifier 206. The preselector 201 is a bandpass filter that blocks all but a selected band of radio channels from appearing at mixer 204, protecting the mixer from overload from undesired signals and preventing signals at the so-called "image" frequency from being converted to IF. The oscillator 202 provides the frequency by which incoming signals will be translated in mixer 204. Injection filter 203 prevents extraneous noise energy from oscillator 202 from degrading the mixer noise performance. The output of mixer 204, which is at a predetermined intermediate frequency, is filtered in first IF filter 205 to remove the undesired products of the frequency conversion process and to couple the desired signal to first IF amplifier 206. The output of amplifier 206 is coupled to receiver 20 as described earlier in the description of FIG. 1.

In addition to providing traditional functions of an IF stage, the elements of block 14' also protect the TBPF circuits from overload. Signal levels are chosen so that in the presence of excessively strong on-channel signals the circuits in stage 14' will saturate and thereby provide a predetermined maximum output amplitude below the overload point of the zero-IF circuits. Protection from limiting on strong off-channel signals is provided by IF filter 205.

Figure 4:
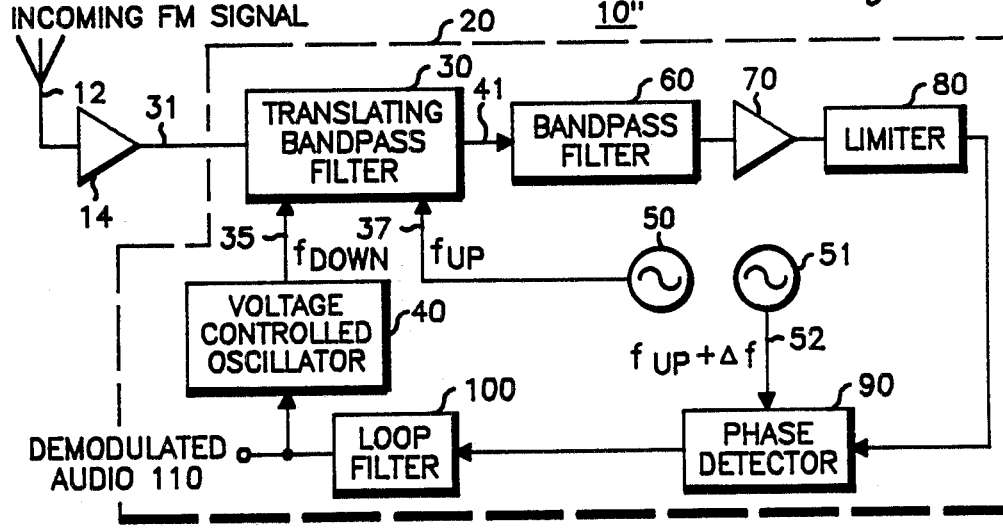
FIG. 4 discloses an additional realization of frequency control arrangement as an alternative to that illustrated in FIG. 1.

FIG. 4 illustrates an embodiment 10'', constructed in accordance with the invention, which includes alternative means for controlling the down-conversion oscillator frequency. Instead of being converted to exactly zero frequency, the translated input signal is provided with a small offset from zero. The purpose of the frequency offset is to avoid the problems of DC offsets yet retain the precise frequency control and inherent demodulation capabilities of the phase lock loop, as in the receiver of FIG. 1. The two input signals to phase detector 90 are now the output signal from limiter 80 and a reference frequency 52 from oscillator 51. Reference 52 differs from up-conversion frequency 37 by a frequency lower than the modulation frequencies to be received. The phase lock loop locks with the output of limiter 80 equal to the frequency of reference oscillator 51. For this to occur, the translated carrier frequency of the signals in the baseband paths of translating filter 30 must equal the difference between frequencies 37 and 52. This occurs when VCO 40 differs from input 31 by the same offset amount. This offset frequency may be set on the order of 10 to 100 Hz. It should be noted that there will be an image response, that is, that input 31 may be offset above or below the VCO. However, the separation between images will be much less than the channel spacings, and no interfering signals should be present.

Because an unmodulated carrier at 31 produces no DC signals in the baseband paths, DC coupling and the need to maintain low offsets may be avoided. Any beat note that may arise because of imperfect matching will be below the lowest modulation frequency and may be blocked from the demodulated output signal by highpass coupling techniques.

In all other respects, the receiver of FIG. 4 is identical with that of FIG. 1 and is designed according to the same principles.

Although the present invention has been disclosed in connection with the embodiments herein, it is understood that the novelty lies in the particular combination of translating bandpass filter, up-conversion to an intermediate frequency at which amplification and limiting are performed, and precise automatic control of the translation frequencies. Modifications and additional applications of the invention apparent to those skilled in the art are included within the scope of the invention.

What is claimed is:

1. A direct, dual conversion receiver for processing radio signals frequency modulated on a carrier frequency comprising:
    translating bandpass filter means having a signal input, an output, and down- and up-conversion frequency inputs;
    first and second frequency sources, coupled to said down- and up-conversion frequency inputs respectively of said translating bandpass filter means;
    means for receiving and supplying said frequency modulated radio signals to said signal input of said translating bandpass filter means;
    means coupled to said output of said translating bandpass filter means for amplifying and amplitude limiting the output signal of said translating bandpass filter means; and
    phase lock loop means for controlling the frequency of said frequency source coupled to said translating filter means down-conversion input to equal the carrier frequency of the signal supplied to said translating filter means signal input and for demodulating said amplitude limited signal and providing a demodulated output.

2. The receiver according to claim 1 wherein said phase lock loop means includes at least:
    a phase detector having an output, a first input coupled to the output of said amplitude limiting means, and a second input coupled to said second frequency source; and
    a controlled oscillator coupled to the output of said phase detector for providing a predetermined frequency in response to said output.

3. The receiver according to claim 1 wherein the response of amplitude versus modulation frequency of the demodulated output is determined primarily by the response of amplitude and phase versus input carrier frequency of said translating bandpass filter means and the loop gain of said phase lock loop means.

4. The receiver according to claim 1 wherein said means for supplying said signals to the signal input of said translating bandpass filter means comprises a radio frequency amplifier.

5. The receiver according to claim 1 wherein said means for supplying said signals to the signal input of said translating bandpass filter means includes preselector means for receiving and filtering the signals and conversion means for converting the same to a predetermined intermediate frequency signal.

6. The receiver according to claim 5 wherein said intermediate frequency signal is bandpass filtered and amplified prior to application to said translating bandpass filter means signal input.

7. A direct, dual conversion receiver for processing radio signals frequency modulated on a carrier frequency comprising:
    translating bandpass filter means having a signal input, an output, and down- and up-conversion frequency inputs;
    first and second frequency sources, coupled to said down- and up-conversion frequency inputs respectively of said translating bandpass filter means;
    means for receiving and supplying said frequency modulated radio signals to said signal input of said translating bandpass filter means;
    means coupled to said output of said translating bandpass filter means for amplifying and amplitude limiting the output signal of said translating bandpass filter means; and
    phase lock loop means for controlling the frequency of said frequency source coupled to said translating filter means down-conversion input to differ by a predetermined offset from the carrier frequency of the signal supplied to said translating filter means signal input and for demodulating said amplitude-limited signal and providing a demodulated output.

8. The receiver according to claim 7 wherein said phase lock loop means includes at least:
    a phase detector having an output, a first input coupled to the output of said amplitude limiting means, and a second input coupled to the second frequency source;
    a controlled oscillator coupled to the output of said phase detector for providing a predetermined frequency in response to said output; and
    means for producing an offset, while the loop is locked, between the frequencies of the signals supplied to said first and second inputs of said phase detector.

9. The receiver according to claim 7 wherein said phase lock loop means includes at least:
    an offset oscillator having a frequency differing from the frequency of said second frequency source by a predetermined amount;

a phase detector having an output, a first input coupled to the output of said amplitude limiting means, and a second input coupled to said offset oscillator; and a controlled oscillator coupled to the output of said phase detector for providing a predetermined frequency in response to said output.

10. The receiver according to claim 7 wherein the amplitude versus modulation frequency response of the demodulated output is determined primarily by the amplitude and phase versus input carrier frequency response of said translating bandpass filter means and the loop gain of said phase lock loop means.

11. The receiver according to claim 7 wherein said means for supplying said signals to the signal input of said translating bandpass filter means comprises a radio frequency amplifier.

12. The receiver according to claim 7 wherein said means for supplying said signals to the signal input of said translating bandpass filter means includes preselector means for receiving and filtering the signals and conversion means for converting the same to a predetermined intermediate frequency signal.

13. The receiver according to claim 12 wherein said intermediate frequency signal is bandpass filtered and amplified prior to application to said translating bandpass filter means signal input 14. The method of processing a received radio signal frequency modulated on a carrier frequency comprising the steps of:

supplying said received radio signal to each of two substantially identical paths;

down-converting the signal supplied to each of said paths by mixing with quadrature outputs of a first frequency source means to translate said signals in phase quadrature to baseband;

lowpass filtering the signal in each of said paths to provide filtered, baseband signals;

mixing said filtered baseband signals with quadrature outputs of a second frequency source having a predetermined frequency to produce two intermediate frequency signals;

summing said intermediate frequency signals to produce a single intermediate frequency signal;

amplifying and amplitude-limiting said single intermediate frequency signal;

applying said amplitude-limited intermediate frequency signal to a phase lock loop means that both controls the frequency of said first frequency source and demodulates said intermediate frequency signal.

15. The method of processing a received radio signal according to claim 14 wherein said received signal is first preselected and frequency converted to a predetermined intermediate frequency prior to mixing said converted signal with said quadrature outputs of said first frequency source means.

16. The method of processing a received radio signal frequency modulated on a carrier frequency comprising the steps of:

supplying said received radio signal to each of two substantially identical paths;

down-converting the signal supplied to each of said paths by mixing with quadrature outputs of a first frequency source means to translate said signals in phase quadrature to a predetermined offset frequency below the range of modulation frequencies;

lowpass filtering the signal in each of said paths to provide lowpass filtered signals;

mixing said lowpass filtered signals with quadrature outputs of a second frequency source having a predetermined frequency to provide two intermediate frequency signals;

summing said intermediate frequency signals to produce a single intermediate frequency signal;

amplifying and amplitude limiting said single intermediate frequency signal;

applying said amplitude-limited intermediate frequency signal to a phase lock loop means that both controls the frequency of said first frequency source and demodulates said intermediate frequency signal.

17. The method of processing a received radio signal according to claim 16 wherein said received signal is first preselected and frequency converted to a predetermined intermediate frequency prior to mixing said converted signal with said quadrature outputs of said first frequency source means.

* * * * *